(12) United States Patent
Kwak et al.

(10) Patent No.: US 9,735,334 B1
(45) Date of Patent: Aug. 15, 2017

(54) APPARATUS FOR MANUFACTURING THERMOELECTRIC MODULE

(71) Applicant: HYUNDAI MOTOR COMPANY, Seoul (KR)

(72) Inventors: Jin Woo Kwak, Gyeongsan-si (KR); Kyong Hwa Song, Seoul (KR); Byung Wook Kim, Seongnam-si (KR); In Woong Lyo, Suwon-si (KR); Han Saem Lee, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 15/184,514

(22) Filed: Jun. 16, 2016

(30) Foreign Application Priority Data

Jan. 26, 2016 (KR) .................. 10-2016-0009598

(51) Int. Cl.
| | |
|---|---|
| *B23K 37/00* | (2006.01) |
| *B23K 37/04* | (2006.01) |
| *B23K 1/00* | (2006.01) |
| *B23K 3/00* | (2006.01) |
| *H01L 35/34* | (2006.01) |
| *H01L 21/68* | (2006.01) |

(52) U.S. Cl.
CPC .......... *H01L 35/34* (2013.01); *B23K 1/0016* (2013.01); *B23K 37/0417* (2013.01); *H01L 21/68* (2013.01)

(58) Field of Classification Search
CPC .......... H05K 2203/082; H05K 3/3478; H05K 2203/0338; H05K 2203/0195; H05K 2203/0292; B23K 3/0623; B23K 2201/40; B23K 1/0016; B23K 37/04

USPC .............. 228/245, 180.21, 20.1; 29/743
See application file for complete search history.

(56) References Cited

U.S. PATENT DOCUMENTS

| | | | |
|---|---|---|---|
| 6,467,275 B1 | 10/2002 | Ghoshal | |
| 2006/0027624 A1* | 2/2006 | Cobbley | B23K 3/0623 228/20.1 |
| 2010/0154854 A1 | 6/2010 | Lee et al. | |

FOREIGN PATENT DOCUMENTS

| | | |
|---|---|---|
| KR | 10-2003-0059301 A | 7/2003 |
| KR | 10-2007-0081441 A | 8/2007 |
| KR | 10-2010-0070029 A | 6/2010 |
| KR | 10-2013-0000881 A | 1/2013 |
| KR | 10-2013-0009443 A | 1/2013 |
| KR | 10-2015-0096180 A | 8/2015 |

OTHER PUBLICATIONS

U.S. 6,381,965, 5/2002, Goshal (withdrawn).
Korean Office Action dated Apr. 21, 2017, issued in Korean Patent Application No. KR 10-2016-0009598.

* cited by examiner

*Primary Examiner* — Erin Saad
(74) *Attorney, Agent, or Firm* — McDermott Will & Emery LLP

(57) ABSTRACT

An apparatus for manufacturing a thermoelectric module includes an alignment mechanism for aligning a plurality of thermoelectric elements with respect to a plurality of electrodes attached to a substrate, wherein the alignment mechanism includes a dispenser having a plurality of injection portions and the plurality of thermoelectric elements is inserted into the plurality of injection portions.

13 Claims, 7 Drawing Sheets

APPARATUS FOR MANUFACTURING THERMOELECTRIC MODULE

CROSS-REFERENCE TO RELATED APPLICATION

This application claims the benefit of priority to Korean Patent Application No. 10-2016-0009598, filed on Jan. 26, 2016 with the Korean Intellectual Property Office, the entirety of which is incorporated herein by reference.

TECHNICAL FIELD

The present disclosure relates to a thermoelectric element, and more particularly, to an apparatus for manufacturing a thermoelectric module capable of conveniently and precisely performing alignment and arrangement of a thermoelectric element.

BACKGROUND

A thermoelectric module uses various methods of showing an interaction of heat with electricity and has a structure of using a Seebeck effect of generating an electromotive force by a temperature difference, a structure of using a Peltier effect of absorbing (or generating) heat by a current, or the like.

The thermoelectric module may include an N-type thermoelectric element and a P-type thermoelectric element which are paired, an upper electrode and a lower electrode each connected to an upper portion and a lower portion of the N-type thermoelectric element and the P-type thermoelectric element, an upper substrate and a lower substrate on which the upper electrode and the lower electrode are each supported, or the like.

Technologies to align and arrange the thermoelectric elements with respect to each electrode, a substrate, or the like during the manufacturing of the thermoelectric module may be required. For this purpose, the related art has used a robot arm, an alignment mechanism, or the like.

As the scheme of using the robot arm aligns individual thermoelectric element one by one, there is a disadvantage in that it takes a large amount of time to align the thermoelectric elements.

As the scheme of using an alignment mechanism requires a separate additional process to configure a final position of the thermoelectric element, there is a disadvantage in that the operation of fitting the final position of the thermoelectric element may require a large degree of work or effort.

Meanwhile, the existing thermoelectric element may have a circular shape or a rectangular parallelepiped shape and therefore has the problem in that the alignment of the thermoelectric elements may be difficult or a large amount of work or effort.

Therefore, a thermoelectric element having a spherical shape has been used to implement the precise and rapid alignment, but the thermoelectric element having the spherical shape may be easily separated from the fixed position even by fine vibrations during the alignment, and therefore a defect rate of the process may be increased.

In particular, since the thermoelectric element having the spherical shape is hard to control a distance between a hot side and a cold side due to structural characteristics of having the same diameter, the thermoelectric element has the disadvantage in that it is difficult to sufficiently secure the temperature difference between the hot side and the cold side and the efficiency of the thermoelectric module may be reduced.

SUMMARY

The present disclosure has been made to solve the above-mentioned problems occurring in the prior art while advantages achieved by the prior art are maintained intact.

An aspect of the present disclosure provides an apparatus for manufacturing a thermoelectric module capable of greatly increasing manufacturing efficiency of the thermoelectric module by very conveniently and precisely performing alignment and arrangement of thermoelectric elements.

According to an exemplary embodiment of the present disclosure, an apparatus for manufacturing a thermoelectric module includes: an alignment mechanism configured to align a plurality of thermoelectric elements with respect to a plurality of electrodes attached to a substrate, in which the alignment mechanism includes a dispenser having a plurality of injection portions and the plurality of thermoelectric elements is inserted into the plurality of injection portions.

The plurality of injection portions may have an inner diameter corresponding to a cross section of each of the thermoelectric elements and an inside of the injection portion is formed with a taper surface.

The plurality of thermoelectric elements may be configured of a pair of thermoelectric elements having opposite polarity to each other and the pair of thermoelectric elements may be configured to include a first thermoelectric element and a second thermoelectric element having a width smaller than that of the first thermoelectric element.

The plurality of injection portions may have more than one first injection portion into which a first thermoelectric element is inserted and more than one second injection portion into which the second thermoelectric element is inserted.

The alignment mechanism may further include an oscillator connected to the dispenser to shake the dispenser.

The apparatus may further include: a bonding mechanism configured to bond the thermoelectric elements aligned with respect to the electrode of the substrate to the electrode of the substrate by the alignment mechanism.

The bonding mechanism may have a heating cartridge generating heat and a plurality of heat conducting portion extending from the heating cartridge, and the plurality of heat conducting portions may be individually inserted into the plurality of injection portions.

According to another exemplary embodiment of the present disclosure, an apparatus for manufacturing a thermoelectric module includes: an alignment mechanism configured to align a thermoelectric element whose at least one end portion has at least partial non-flat surface with respect to an electrode of a substrate; and a bonding mechanism configured to bond the thermoelectric element aligned by the alignment mechanism to the electrode of the substrate, in which the alignment mechanism includes a dispenser having a plurality of injection portions and the plurality of thermoelectric elements is inserted into the plurality of injection portions.

The thermoelectric element may have a body, a first end portion provided at one end of the body, and a second end portion provided at the other end of the body, and the first end portion or the second end portion may have at least partial non-flat surface.

The body may have a length longer than a width thereof.

At least one of the first end portion and the second end portion may have a curved portion having a predetermined curvature radius.

At least one of the first end portion and the second end portion may have a conical surface or a pyramidal surface.

An edge of at least one of the first end portion and the second end portion may be formed with a round portion.

The first end portion may have a curved portion having a first curvature radius and the second end portion may have a curved portion having a second curvature radius.

The first curvature radius may be equal to the second curvature radius.

The first curvature radius may be different from the second curvature radius.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
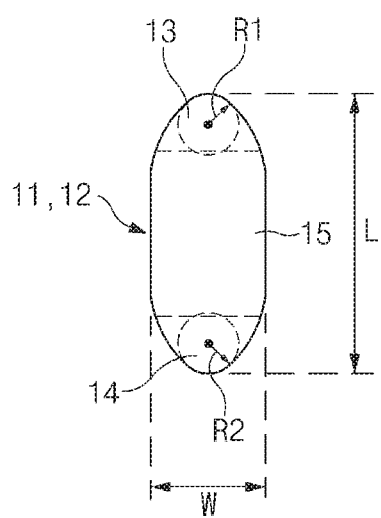
FIG. 1 is a diagram illustrating a thermoelectric element used in an apparatus for manufacturing a thermoelectric module according to an exemplary embodiment of the present disclosure.

Hereinafter, exemplary embodiments of the present disclosure will be described in detail with reference to the accompanying drawings. For reference, size of components, thickness of lines, and the like which are illustrated in the drawings referenced for describing exemplary embodiments of the present disclosure may be slightly exaggerated to aid understanding. Further, terms used to describe the present disclosure are defined in consideration of functions in the present disclosure and therefore may be changed depending on a user, an operator's intention, a practice, and the like. Therefore, the definition of the terminologies should be construed based on the contents throughout the specification.

Figure 6:
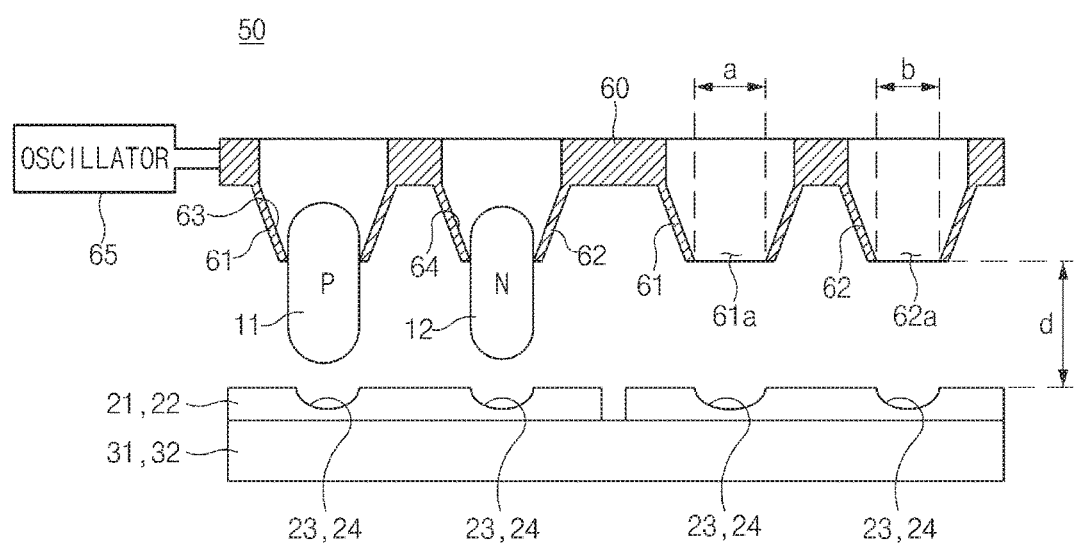
FIG. 6 is a diagram illustrating an alignment mechanism of an apparatus for manufacturing a thermoelectric module according to various exemplary embodiments of the present disclosure.

Referring to FIG. 6, an apparatus for manufacturing a thermoelectric module according to an exemplary embodiment of the present disclosure may include an alignment mechanism 50 configured to align a plurality of thermoelectric elements 11 and 12 with respect to a plurality of electrodes 21 and 22 attached to substrates 31 and 32.

FIGS. 1 to 4 illustrate various examples of the thermoelectric elements 11 and 12 which may be used in the apparatus for manufacturing a thermoelectric module according to exemplary embodiments of the present disclosure.

Referring to FIG. 1, the thermoelectric elements 11 and according to an exemplary embodiment of the present disclosure may include a body 15 having a predetermined length L and a first end portion 13 and a second end portion 14 formed at both ends of the body 15.

The body 15 may be formed as a cylindrical shape and a rectangular shape. The body 15 may have a length L longer than a width W thereof. The length L of the body 15 may preferably have a length enough to prevent an increase in resistance while securing a temperature difference between a hot side and a cold side.

Both ends in a longitudinal direction of the body 15 may be provided with the first end portion 13 and the second end portion 14 which may be positioned at opposite sides from each other along the longitudinal direction of the body 15.

At least one of the first end portion 13 and the second end portion 14 may be formed to have at least a partial non-flat surface, such that each of the thermoelectric elements 11 and 12 may be formed in a bullet shape.

As such, according to an exemplary embodiment of the present disclosure, as the thermoelectric elements 11 and 12 are formed in the bullet shape, a contact area with an electrode may be increased, such that positioning and/or adhesion of the thermoelectric elements 11 and 12 may be greatly improved.

According to an exemplary embodiment of FIG. 1, the first end portion 13 may be formed in a curved portion curved in a first curvature radius R1 at one end of the body 15 and the second end portion 14 may be formed in a curved portion curved in a second curvature radius R2 at the other end of the body 15.

Meanwhile, the first curvature radius R1 may be equal to the second curvature radius R2, or the first curvature radius R1 may be different from the second curvature radius R2.

Figure 2:
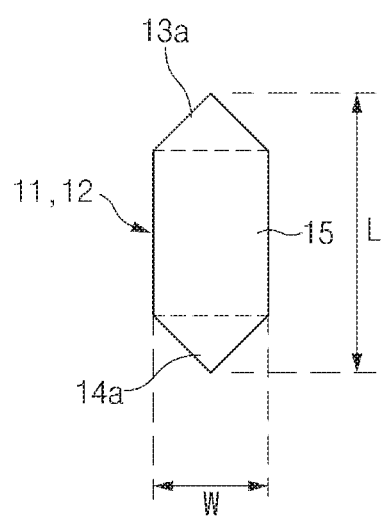
FIG. 2 is a diagram illustrating a thermoelectric element according to an alternative exemplary embodiment from that shown in FIG. 1.

According to an exemplary embodiment of FIG. 2, a first end portion 13a and/or a second end portion 14a of the body 15 may have a conical surface or a pyramidal surface of which a width narrows towards opposite ends.

Figure 3:
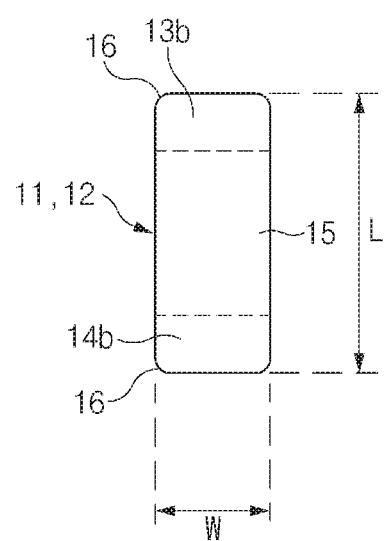
FIG. 3 is a diagram illustrating a thermoelectric element according to another alternative exemplary embodiment from that shown in FIG. 1.

According to an exemplary embodiment of FIG. 3, a first end portion 13b or a second end portion 14b may have the same width as the body 15 and an edge of the first end portion 13b and/or the second end portion 14b may be formed with a round portion 16 having a predetermined radius.

Figure 4:
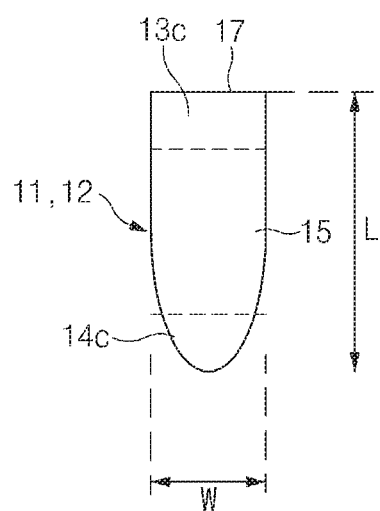
FIG. 4 is a diagram illustrating a thermoelectric element according to yet another alternative exemplary embodiment from that shown in FIG. 1.

According to an exemplary embodiment of FIG. 4, the first end portion 13c may have the same width as the body 15, a cross section of the first end portion 13c may be formed with a flat surface 17, and the second end portion 14c may have a curved portion having a predetermined curvature radius.

As such, the thermoelectric elements 11 and 12 according to an exemplary embodiment of the present disclosure may be formed in a bullet shape where at least one end portion of the body 15 is formed with the curved portion which includes at least partial non-flat surface, and the contact area with the electrodes 21 and 22 may be increased by the bullet shape, such that the positioning and/or adhesion of the thermoelectric element may be greatly improved.

Figure 5:
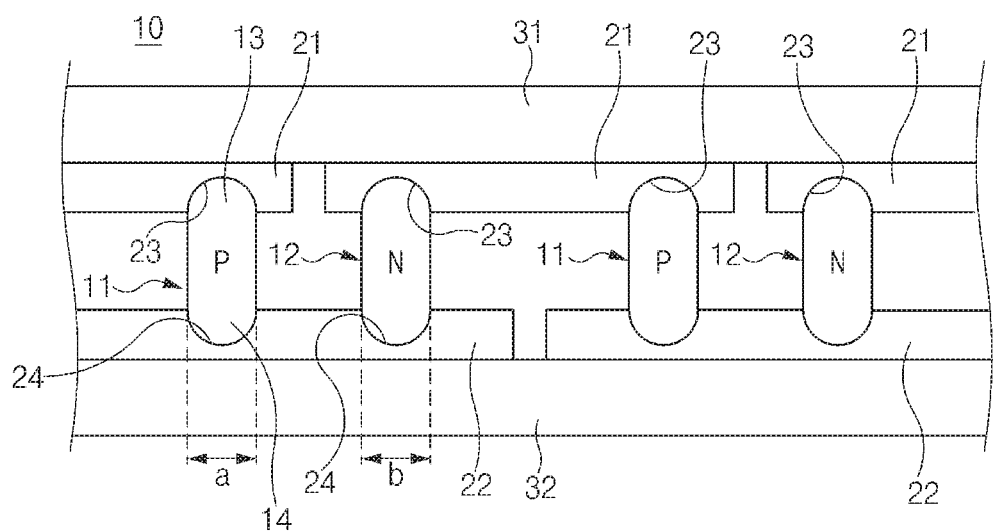
FIG. 5 is a diagram illustrating a thermoelectric module manufactured by an apparatus for manufacturing a thermoelectric module according to an exemplary embodiment of the present disclosure.

Referring to FIG. 5, the thermoelectric module 10 according to an exemplary embodiment of the present disclosure may include the upper substrate 31 and the lower substrate 32 spaced apart from each other in a vertical direction and the plurality of thermoelectric elements 11 and 12 and the plurality of electrodes 21 and 22 disposed between the upper substrate 31 and the lower substrate 32.

The upper substrate 31 and the lower substrate 32 may configure the hot side and the cold side and each of the substrates 31 and 32 may be made of an insulating material.

As illustrated in FIGS. 1 to 4, the plurality of thermoelectric elements 11 and 12 may be formed in the bullet shape in which at least one end portion is formed with at least a partial non-flat surface.

The plurality of thermoelectric elements 11 and 12 may include at least a pair of thermoelectric elements 11 and 12 having opposite polarity to each other and the thermoelectric elements 11 and 12 may be made of an N-type semiconductor and a P-type semiconductor.

Meanwhile, since the N-type semiconductor and the P-type semiconductor each have different figures of merit (ZT), the pair of thermoelectric elements 11 and 12 may preferably have different cross sectional areas. Therefore, to differently set the cross sectional areas of the thermoelectric elements 11 and 12 having the opposite polarity to each other, the pair of thermoelectric elements 11 and 12 may be formed to have different widths.

In particular, the first thermoelectric element 11 may be made of the P-type semiconductor and the second thermoelectric element 12 may be made of the N type semiconductor. Further, to optimize the power performance of the thermoelectric module 10, a width 'a' of the first thermoelectric element 11 may be formed to be larger than a width 'b' of the second thermoelectric element 12.

The upper electrode 21 may be connected to upper ends of the adjacent thermoelectric elements 11 and 12 and the upper electrode 21 may be formed with a groove 23 into which the first end portion 13 of the thermoelectric elements 11 and 12 is inserted.

The lower electrode 22 may be connected to lower ends of the thermoelectric elements 11 and 12 and the lower electrode 22 may be formed with a groove 24 into which the second end portion 14 of the thermoelectric elements 11 and 12 is inserted.

The groove 23 of the upper electrode 21 and the groove 24 of the lower electrode 22 may have a shape corresponding to first end portions 13, 13a, 13b, and 13c and second end portions 14, 14a, 14b, and 14c of the thermoelectric elements 11 and 12.

FIG. 5 illustrates the thermoelectric elements 11 and 12 according to an exemplary embodiment of FIG. 1, in which the groove 23 of the upper electrode 21 and the groove 24 of the lower electrode 22 may be formed in a groove structure that is curved corresponding to the first and second end portions 13 and 14 formed in the curved portions of the thermoelectric elements 11 and 12.

In addition, according to an exemplary embodiment of FIG. 2, as the first and second end portions 13a and 14a of the thermoelectric elements 11 and 12 are formed in a conical surface or a pyramidal surface, the groove 23 of the upper electrode 21 and the groove 24 of the lower electrode 22 may be formed in the groove structure having the conical surface or the pyramidal surface.

According to an exemplary embodiment of FIG. 3, as the first and second end portions 13b and 14b of the thermoelectric elements 11 and 12 are formed in a structure having a round portion 16, the groove 23 of the upper electrode 21 and the groove 24 of the lower electrode 22 may be formed in a structure in which an edge has the round portion.

According to an exemplary embodiment of FIG. 4, as the first end portion 13c of the thermoelectric elements 11 and 12 may be formed in a structure having the flat surface 17, the groove 23 of the upper electrode 21 may be formed in a structure having a flat surface and when the second end portion 14c of the thermoelectric elements 11 and 12 is formed in a curved structure, the groove 24 of the lower electrode 22 may be formed in the curved groove structure.

As such, as the groove 23 of the upper electrode 21 and the groove 24 of the lower electrode 22 may be formed in a structure corresponding to the first and second end portions 13, 13a, 13b, 13c, 14, 14a, 14b, and 14c of the thermoelectric elements 11 and 12, the thermoelectric elements 11 and 12 may be precisely positioned in the groove 23 of the upper electrode 21 and/or the groove 24 of the lower electrode 22, the adhesion thereof may be greatly improved, and thermal resistance and electric resistance may be reduced to improve the performance of the thermoelectric module 10.

Further, the upper electrode 21 and the lower electrode 22 may be alternately disposed to each other to smooth a flow of current and heat.

As such, the thermoelectric elements 11 and 12 according to an exemplary embodiment of the present disclosure may be formed in the bullet shape in which at least one end portion of the body 15 is formed with at least a partial non-flat surface and the upper electrode 21 and the lower electrode 22 have the grooves 23 and 24 corresponding to the end portions of the thermoelectric elements 11 and 12, such that the positioning and/or adhesion of the thermoelectric elements 11 and 12 may be greatly improved, thereby minimizing a defect rate during the manufacturing process of the thermoelectric module 10.

In particular, as the length L of the thermoelectric elements 11 and 12 is optimized, the distance between the hot side and the cold side of the thermoelectric module 10 may be appropriately controlled, such that the temperature difference between the hot side and the cold side may be sufficiently secured.

Figure 7:
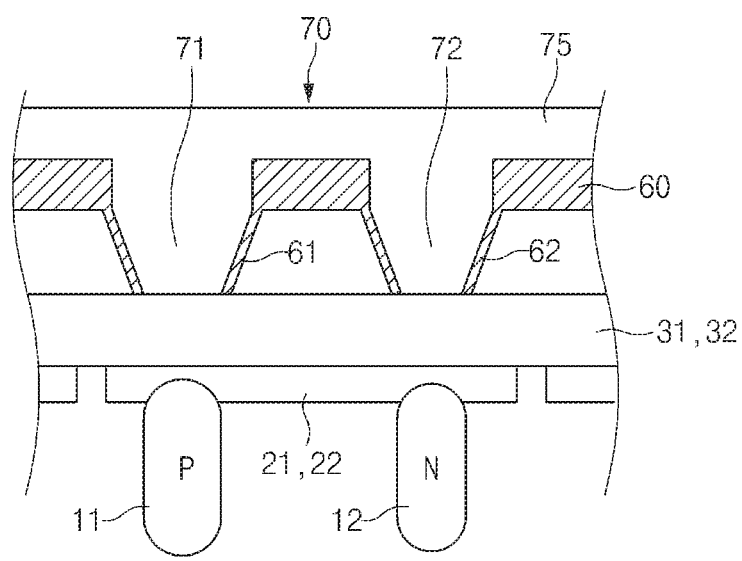
FIG. 7 is a diagram illustrating a bonding mechanism of an apparatus for manufacturing a thermoelectric module according to various exemplary embodiments of the present disclosure.

FIGS. 6 and 7 illustrate an apparatus for manufacturing a thermoelectric module according to various exemplary embodiments of the present disclosure.

Referring to FIG. 6, the apparatus for manufacturing a thermoelectric module according to an exemplary embodiment of the present disclosure may include the alignment mechanism 50 configured to align the plurality of thermoelectric elements 11 and 12 with respect to the plurality of electrodes 21 and 22 attached to the substrates 31 and 32.

The alignment mechanism 50 may have a dispenser 60 having a plurality of injection portions 61 and 62 and the plurality of thermoelectric elements 11 and 12 may be inserted into the injection portions 61 and 62 of the dispenser 60 and then inserted into the grooves 23 and 24 of the electrodes 21 and 22 attached to the substrates 31 and 32, such that the plurality of thermoelectric elements 11 and 12 may be very stably aligned and arranged with respect to the electrodes 21 and 22 of the substrates 31 and 32.

The plurality of injection portions 61 and 62 may have an inner diameter corresponding to the width of the thermoelectric elements 11 and 12, and an inside of each of the injection portions 61 and 62 may be formed with taper surfaces 63 and 64 so that the thermoelectric elements 11 and 12 are stably inserted into the injection portions 61 and 62.

In particular, the plurality of injection portions 61 and 62 may have more than one first injection portion 61 into which the first thermoelectric element 11 is inserted and more than one second injection portion 62 into which the second thermoelectric element 12 is inserted.

A lower opening 61a of the first injection portion 61 may be formed to be equal to the width 'a' of the first thermoelectric element 11 and a lower opening 62a of the second injection portion 62 may be formed to be equal to a width 'b' of the second thermoelectric element 12.

Therefore, when the first thermoelectric element 11 is first inserted into the dispenser 60, the width 'a' of the first thermoelectric element 11 may be formed to be larger than the width of the lower opening 62a of the second injection portion 62, such that the first thermoelectric element 11 may not pass through the second injection portion 62 but may pass through only the first injection portion 61. As such, the first thermoelectric element 11 may first be inserted and thus may be stably aligned and arranged with respect to the electrodes 21 and 22 of the substrates 31 and 32. Next, if the second thermoelectric element 12 is inserted into the dispenser 60, the second thermoelectric element 12 may pass through the second injection portion 62 to be stably aligned and arranged with respect to the electrodes 21 and 22 of the substrates 31 and 32.

Further, when the plurality of thermoelectric elements 11 and 12 are aligned with respect to the electrodes 21 and 22 of the substrates 31 and 32 by the dispenser 60, a distance 'd' between the dispenser 60 and the electrodes 21 and 22 may be set to be smaller than the length 'L' of the thermoelectric elements 11 and 12, such that the thermoelectric elements 11 and 12 may be precisely aligned with respect to the electrodes 21 and 22 of the substrates 31 and 32.

Further, the alignment mechanism 50 may further include an oscillator 65 connected to one side of the dispenser 60, and the dispenser 60 may be shaken horizontally by the oscillator 65, such that the plurality of thermoelectric elements 11 and 12 may be precisely and easily aligned with respect to the electrodes 21 and 22 of the substrates 31 and 32.

Meanwhile, prior to the alignment operation of the thermoelectric elements 11 and 12 by the dispenser 60, the grooves 23 and 24 of the electrodes 21 and 22 may be previously applied with a brazing filler (powder or film form) which may be an adhesive. The brazing filler may be heated to bond the thermoelectric elements 11 and 12 to the electrodes 21 and 22. The grooves 23 of the electrodes 21 and 22 adjacent to the hot side may be applied with the brazing filler having a high melting point and the grooves 24 of the electrodes 21 and 22 adjacent to the cold side may be applied with the brazing filler having a low melting point.

Referring to FIG. 7, an apparatus for manufacturing a thermoelectric module according to an exemplary embodiment of the present disclosure may further include a bonding mechanism 70 for bonding the thermoelectric elements 11 and 12 to the grooves 23 and 24 of the electrodes 21 and 22 after the thermoelectric elements 11 and 12 are aligned by the alignment mechanism 50.

The bonding mechanism 70 may have a heating cartridge 75 generating heat and a plurality of heat conducting portions 71 and 72 extending from the heating cartridge 75.

The plurality of heat conducting portions 71 and 72 may be individually inserted into the plurality of injection portions 61 and 62 to transfer heat to the grooves 23 and 24 of the electrodes 21 and 22 and the thermoelectric elements 11 and 12. The thermoelectric elements 11 and 12 may be firmly bonded to the grooves 23 and 24 of the electrodes 21 and 22 while the brazing filler previously applied to the grooves 23 and 24 of the electrodes 21 and 22 is melted by the transferred heat.

The plurality of heat conducting portions 71 and 72 may include a first heat conducting portion 71 inserted into the first injection portion 61 and a second heat conducting portion 72 inserted into the second injection portion 62.

As described above, according to an exemplary embodiment of the present disclosure, it is possible to conveniently and precisely perform the alignment and the arrangement of the thermoelectric elements and stably secure the temperature difference between the hot side and the cold side, thereby improving the efficiency of the thermoelectric module.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An apparatus for manufacturing a thermoelectric module, comprising:
    an alignment mechanism for aligning a plurality of thermoelectric elements with respect to a plurality of electrodes attached to a substrate; and
    a bonding mechanism for bonding the plurality of aligned thermoelectric elements to the plurality of electrodes of the substrate,
    wherein the alignment mechanism includes a dispenser having a plurality of injection portions and the plurality of thermoelectric elements is inserted into the plurality of injection portions,
    the bonding mechanism having a heating cartridge for generating heat and a plurality of heat conducting portions extending from the heating cartridge, and each of the plurality of heat conducting portions is individually inserted into one of the plurality of injection portions.

2. The apparatus according to claim 1, wherein the plurality of injection portions have an inner diameter corresponding to a cross section of each of the thermoelectric elements and an inside of the injection portion is formed with a tapered surface.

3. The apparatus according to claim 2, wherein the plurality of thermoelectric elements includes a pair of thermoelectric elements having opposite polarities to each other and the pair of thermoelectric elements includes a first thermoelectric element and a second thermoelectric element having a width smaller than that of the first thermoelectric element.

4. The apparatus according to claim 3, wherein each of the plurality of injection portions has more than one first injection portion into which the first thermoelectric element is inserted and more than one second injection portion into which the second thermoelectric element is inserted.

5. The apparatus according to claim 1, wherein the alignment mechanism further includes an oscillator connected to the dispenser to shake the dispenser.

6. The apparatus according to claim 1, wherein the thermoelectric element has a body, a first end portion provided at one end of the body, and a second end portion provided at the other end of the body, and the first end portion or the second end portion has at least a partial non-flat surface.

7. The apparatus according to claim 6, wherein the body has a length longer than a width thereof.

8. The apparatus according to claim 6, wherein at least one of the first end portion and the second end portion has a curved portion having a predetermined curvature radius.

9. The apparatus according to claim 6, wherein at least one of the first end portion and the second end portion has a conical surface or a pyramidal surface.

10. The apparatus according to claim 6, wherein an edge of at least one of the first end portion and the second end portion is formed with a round portion.

11. The apparatus according to claim 6, wherein the first end portion has a curved portion having a first curvature radius and the second end portion has a curved portion having a second curvature radius.

12. The apparatus according to claim 11, wherein the first curvature radius is equal to the second curvature radius.

13. The apparatus according to claim 11, wherein the first curvature radius is different from the second curvature radius.

* * * * *